United States Patent [19]
Kawamura et al.

[11] Patent Number: 5,896,310
[45] Date of Patent: Apr. 20, 1999

[54] MULTIPLE BANK MEMORY WITH OVER-THE-ARRAY CONDUCTORS PROGRAMMABLE FOR PROVIDING EITHER COLUMN FACTOR OR Y-DECODER POWER CONNECTIVITY

[75] Inventors: J. Patrick Kawamura, Richardson; Harvey A. Vargis, Garland, both of Tex.

[73] Assignee: Texas Instruments Incorporated, Dallas, Tex.

[21] Appl. No.: 08/998,338

[22] Filed: Dec. 24, 1997

[51] Int. Cl.$^6$ ................................................ G11C 5/06
[52] U.S. Cl. .................................... 365/51; 365/63
[58] Field of Search .................... 365/230.03, 51, 365/63, 72

[56] References Cited

U.S. PATENT DOCUMENTS

| | | | |
|---|---|---|---|
| 5,619,472 | 4/1997 | Okamura | 365/51 |
| 5,627,792 | 5/1997 | Tsujimoto | 365/51 |
| 5,808,930 | 9/1998 | Wadd et al. | 365/51 |

*Primary Examiner*—Tan T. Nguyen
*Attorney, Agent, or Firm*—Robby T. Holland; Carlton H. Hoel; Richard L. Donaldson

[57] ABSTRACT

A memory configuration (20) which includes a first and second bank (B0, B1). Both bank arrays comprises a plurality of wordlines (WLs) and bitlines (BLs). The memory configuration further includes a plurality of column decoder circuits (CDEC0–CDEC7), and a plurality of y-select conductors (C0–C15) generally parallel to the plurality of bitlines of the first bank array. Each of the plurality of y-select conductors is operable to be selected by one of the plurality of column decoder circuits in response to a column address. The memory configuration further includes a plurality of column factor conductors ($F0_I$, $F1_I$, $F2_I$) formed in a direct periphery area existing between the first and second bank arrays. Still further, the memory configuration includes a power conductor ($PDD_I$) formed between the first and second bank arrays, and aligned generally parallel to the plurality of wordlines of the first and second bank arrays. Lastly, the memory configuration includes a plurality of programmable conductors (PC0–PC7) disposed between and generally parallel to the plurality of y-select conductors. The programmable conductors are formed such that a first portion of each of the plurality of programmable conductors overlies the first bank array and a second portion of each of the plurality of programmable conductors extends toward the direct periphery. Each of the plurality of programmable conductors may be selected for connecting to a corresponding one of the plurality of column factor conductors or to the power conductor.

35 Claims, 5 Drawing Sheets

5,896,310

MULTIPLE BANK MEMORY WITH OVER-THE-ARRAY CONDUCTORS PROGRAMMABLE FOR PROVIDING EITHER COLUMN FACTOR OR Y-DECODER POWER CONNECTIVITY

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to digital memory circuits, and are more particularly directed to a multiple bank memory with over-the-array conductors that are programmable to provide connections for either column factor lines or y-decoder power lines.

The technology of many modern circuit applications continues to advance at a rapid pace, with memory circuits continually being improved and refined to meet performance and economic requirements. For such memories, consideration is given to all aspects of design, including increasing performance and minimizing costs. These considerations may be further evaluated based on the integrated circuit device in which the memory is formed, where such circuits may be implemented either as stand-alone products, or as part of a larger circuit such as a microprocessor. While performance factors of the digital memory such as overall circuit speed are important, an often equally or even more critical factor is the cost of the device. This cost is often reflected in the overall size of the memory array. Thus, a desirable memory reduces device size while providing acceptable functionality and speed.

In the current art, memory size may be affected by various factors. In one prior art approach, as detailed later, this size is affected not merely by the storage cell area, but further by the power and row and column factor conductors which are involved in address decoding for accessing the storage cells in the storage area. By way of background, some prior art systems have been developed which space various conductors in certain manners to reduce overall device size. For example in one approach, row decoding factor conductors are sometimes placed parallel to wordlines (i.e., in the x-dimension) for locally decoding the component of the address which pertains to the device wordlines. As another example, some architectures have included fixed power conductors which are parallel to the memory bank y-select columns and indeed overlie the memory banks. These approaches, however, have provided limited solutions to only certain architectures, and do not singly address the problems described below which arise from the use of power and column factor conductors extending from the main wordline decoding area of the device. Thus, these problems are detailed below as is the preferred embodiment which overcomes the prior art drawbacks and thus provides a more efficient and desirable memory configuration.

BRIEF SUMMARY OF THE INVENTION

In one embodiment there is a memory configuration which includes a first and second bank array. Both bank arrays comprise a plurality of wordlines and a plurality of bitlines. The wordlines of the first bank array are generally parallel to the wordlines of the second bank array. The bitlines of the first bank array are generally orthogonal to the wordlines of the first bank array, and the bitlines of the second bank array are generally orthogonal to the wordlines of the second bank array. The memory configuration further includes a plurality of column decoder circuits, and a plurality of y-select conductors generally parallel to the plurality of bitlines of the first and second bank arrays. Each of the plurality of y-select conductors is operable to be selected by one of the plurality of column decoder circuits in response to a column address. The memory configuration further includes a plurality of column factor conductors formed in a direct periphery area existing between the first and second bank arrays. The column factors are also aligned generally parallel to the plurality of wordlines of the first and second bank arrays. Still further, the memory configuration includes a power conductor formed between the first and second bank arrays, and aligned generally parallel to the plurality of wordlines of the first and second bank arrays. Lastly, the memory configuration includes a plurality of programmable conductors disposed between and generally parallel to the plurality of y-select conductors. The programmable conductors are formed such that a first portion of each of the plurality of programmable conductors overlies the first bank array and a second portion of each of the plurality of programmable conductors extends toward the direct periphery. Each of the plurality of programmable conductors may be selected for connecting to a corresponding one of the plurality of column factor conductors or to the power conductor. Other circuits, systems, and methods are also disclosed and claimed.

BRIEF DESCRIPTION OF THE SEVERAL VIEWS OF THE DRAWING

FIG. 2b illustrates a layout diagram of the multiple bank memory configuration of FIG. 2a after the metal 3 layer is formed, and having power and factor conductors which do not extend into the wordline decoder area of the configuration and further including programmable conductors aligned with the feed conductors from FIG. 2a;

DETAILED DESCRIPTION OF THE INVENTION

Figure 1:
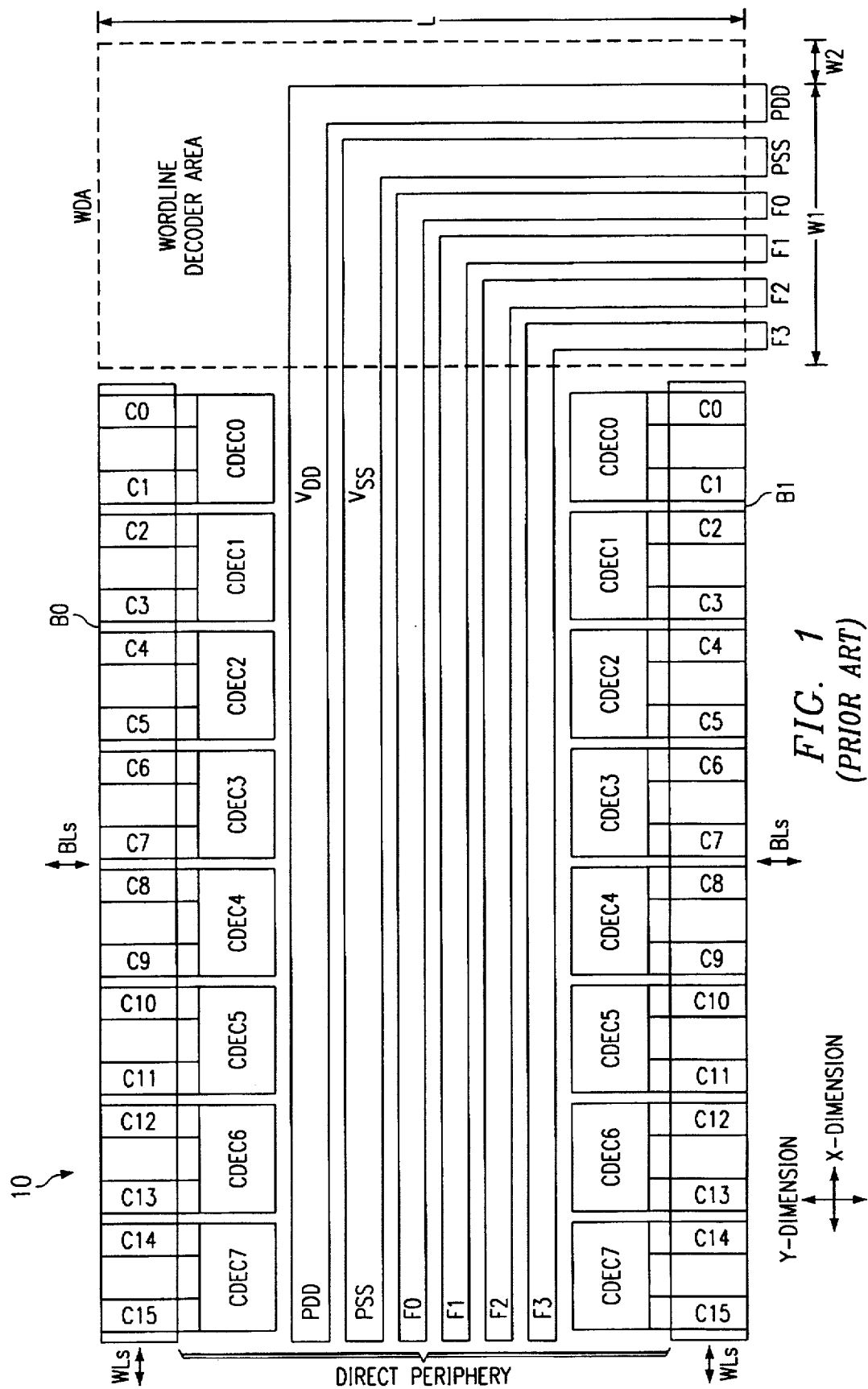
FIG. 1 illustrates a layout diagram of a prior art multiple bank memory configuration having power and factor conductors extending into the wordline decoder area of the configuration.

Before proceeding with a detailed discussion of the preferred inventive embodiment and by way of presenting a more extensive introduction, FIG. 1 and the following discussion presents an explanation of a prior art memory configuration 10 and concludes with some observations about its drawbacks as improved upon by the preferred embodiment. Memory configuration 10 is representative of the type of layout typically found for a memory system formed in an integrated circuit, that is, in a component formed with a semiconductor base and various layers formed above that base. In FIG. 1, the illustration reflects generally a top view of the location of various components of the memory system, with various items not shown but understood to exist within various lower layers of the device. Turning to memory configuration 10, it includes multiple memory banks which by way of example are shown in FIG. 1 as bank B0 and bank B1. Each of banks B0 and B1 is constructed as a memory array and, therefore includes a number of wordlines and a number of bitlines, where each intersection of a wordline with bitlines represents a storage cell for storing data. The number of wordlines and columns in banks B0 and B1 depends on a particular implementation. For sake of simplifying the present illustration and discussion, the wordlines are not shown in FIG. 1 but are understood, as is convention in the memory art, to be disposed in the horizontal or x-direction. This convention is demonstrated generally by the horizontal arrow and "WLs" abbreviation next to banks B0 and B1. Similarly for the sake of simplifying the drawing, the bitlines are not shown in FIG. 1 but are understood, as is convention in the memory art, to be disposed in the vertical or y-direction. This convention is demonstrated generally by the vertical arrow and "BLs" abbreviation above bank B0 and below bank B1. Memory configuration 10 further includes a plurality of y-select conductors disposed within banks B0 and B1. The number of y-select conductors may vary, but to simplify the illustration only sixteen y-select conductors are shown for each bank. As a practical matter, in current memories the actual number of y-select conductors may be much higher. Looking to the sixteen illustrated y-select conductors of each bank, they are shown in FIG. 1 as C0 through C15.

Memory configuration 10 further includes a wordline decoder area WDA which spans the vertical dimension of both banks B0 and B1, and also along the vertical dimension between those banks where that vertical dimension is sometimes referred to in the art as the direct periphery. Wordline decoder area WDA is shown in phantom in FIG. 1 to indicate the area in which the circuitry for accomplishing wordline decoding is located. Specifically, it is intended by FIG. 1 for wordline decoder area WDA to represent the area of the integrated circuit that includes the necessary circuitry for receiving the address signal and decoding it to a level sufficient to choose one of several wordlines from either bank B0 or bank B1 in response to that address signal. Thus, while not shown, wordline decoder area WDA is understood to include various address signal lines, decoder circuits, and wordline factors all used in this capacity.

Looking to the direct periphery between bank B0 and bank B1, it includes various circuitry for decoding an address so that data may be communicated with respect to storage cells in the banks. Note that the term "communicating" is used so that it is understood that the discussion here applies equally to either reading data from a bank or writing data to storage cells in a bank. Such communication is accomplished with the y-select conductors of each memory bank by associating pairs of those y-select conductors with corresponding column decoder circuits. For example, y-select conductors C0 and C1 of bank B0 are paired and associated with a column decoder circuit CDEC0. The association of each pair of y-select conductors with a decoder circuit arises from the operation of sense amplifiers which are not shown, but which are well understood in the art. More particularly, note that the paired y-select conductors extend in the y-dimension from each column decoder circuit in FIG. 1. Although not shown, at the memory bank end of the extending y-select conductors the memory bank also includes sense amplifier circuits. Each sense amplifier circuit is connected to receive enabling signals from the extending y-select conductors. For example, when a given column decoder circuit determines that one of its two corresponding y-select conductors is being addressed, it asserts the appropriate one of its two y-select conductors, which in turn enables a transistor gate in the sense amplifier so that the bitlines corresponding to the asserted y-select conductor may communicate, i.e., either read or write, data either to or from those corresponding bitlines to a sense amplifier and the data line from the periphery of the device. Thus, any of these y-select conductors may be accessed in this manner in response to a column address applied to memory configuration 10. In addition to this aspect, note also that an address as applied to memory configuration 10 is commonly separated into a row (or wordline) component and a column (or y-select) component. The circuitry in wordline decoder area WDA decodes the wordline component and thereby causes one or several of the wordlines in either bank B0 or bank B1 to be activated, while the various column decoder circuits decode the y-select component to enable a sense amplifier connection between the bitlines and the data lines from the periphery of the device using one of y-select conductors C0 through C15 in either bank B0 or bank B1. As a result, data communication may occur with respect to the selected data cell which corresponds to the selected wordline and selected y-select conductor.

Given the general decoding functionality described above, note further that the direct periphery includes additional conductors which operate in conjunction with the column decoder circuits described above, and which are located generally parallel to the wordlines of banks B0 and B1. These conductors include two power conductors designated PDD and PSS, where the latter two letters in each designation indicate that the conductors are provided to conduct signals $V_{DD}$ and $V_{SS}$, respectively, to the column decoder circuits in the direct periphery. While not completely illustrated in FIG. 1, it should be understood by one skilled in the art that additional conductive paths are formed from these power conductors to the various circuits within the direct periphery which require access to $V_{DD}$ and $V_{SS}$. The direct periphery further includes column factor conductors. As known in the art, a "factor" is a conductor known to carry signals as part of the address decoding functionality. Thus, by way of example, FIG. 1 illustrates four such factor conductors designated F0, F1, F2, and F3. Note that the actual number of column factor conductors may vary and indeed may be much larger than four conductors as shown. Nevertheless, in the current example it is assumed that from these factor conductors, one of the total of sixteen columns for banks B0 and B1 may be selected by a given address. Again, therefore, while not completely illustrated in FIG. 1, it should be understood by one skilled in the art that additional conductive paths are formed from the factor conductors to the various column decoder circuits to permit this functionality.

Having presented additional background of the prior art memory configuration 10 of FIG. 1, the present inventors have recognized various of its drawbacks which are improved upon by the inventive embodiments described below. Specifically, one considerable drawback of memory configuration 10 is in the context of total area required of the layout, and more particularly arises from the power and factor conductors of the direct periphery. Specifically, in addition to having first portions extending generally parallel to the wordlines of banks B0 and B1 and between those banks, each of these conductors includes a second portion. These second portions first extend into wordline decoder area WDA, and then turn an angle of 90 degrees from the first portion to extend into the periphery region of the device. These second portions are included to provide a contact point to each of these conductors so that the respective signals (e.g., power or address) may be provided to the conductors for the periphery. Given the existence of these second portions, note that they effectively increase the size of wordline decoder area WDA. In other words, as an approximation these second portions when combined consume a distance W1 in the overall width of W1+W2 in the x-dimension of wordline decoder area WDA. Additionally, these second portions consume a distance L in the y-dimension of wordline decoder area WDA. Consequently, a total additional area of W1 * L is required to accommodate these second portions. As stated in the Background Of The Invention section of this document, and as known in the art, any additional space on an integrated circuit which can be conserved is highly advantageous in the art. As shown below, the inventive embodiments reduce this area consumption requirement. In addition, the inventive embodiments accomplish the same functionality of these second portions using a more flexible layout with respect to the choice of the location of the y-dimension component of each conductor. These as well as other benefits will be appreciated by one skilled in the art, given reference to the following discussion of the invention and its corresponding illustration in the Figures.

Figure 2A:
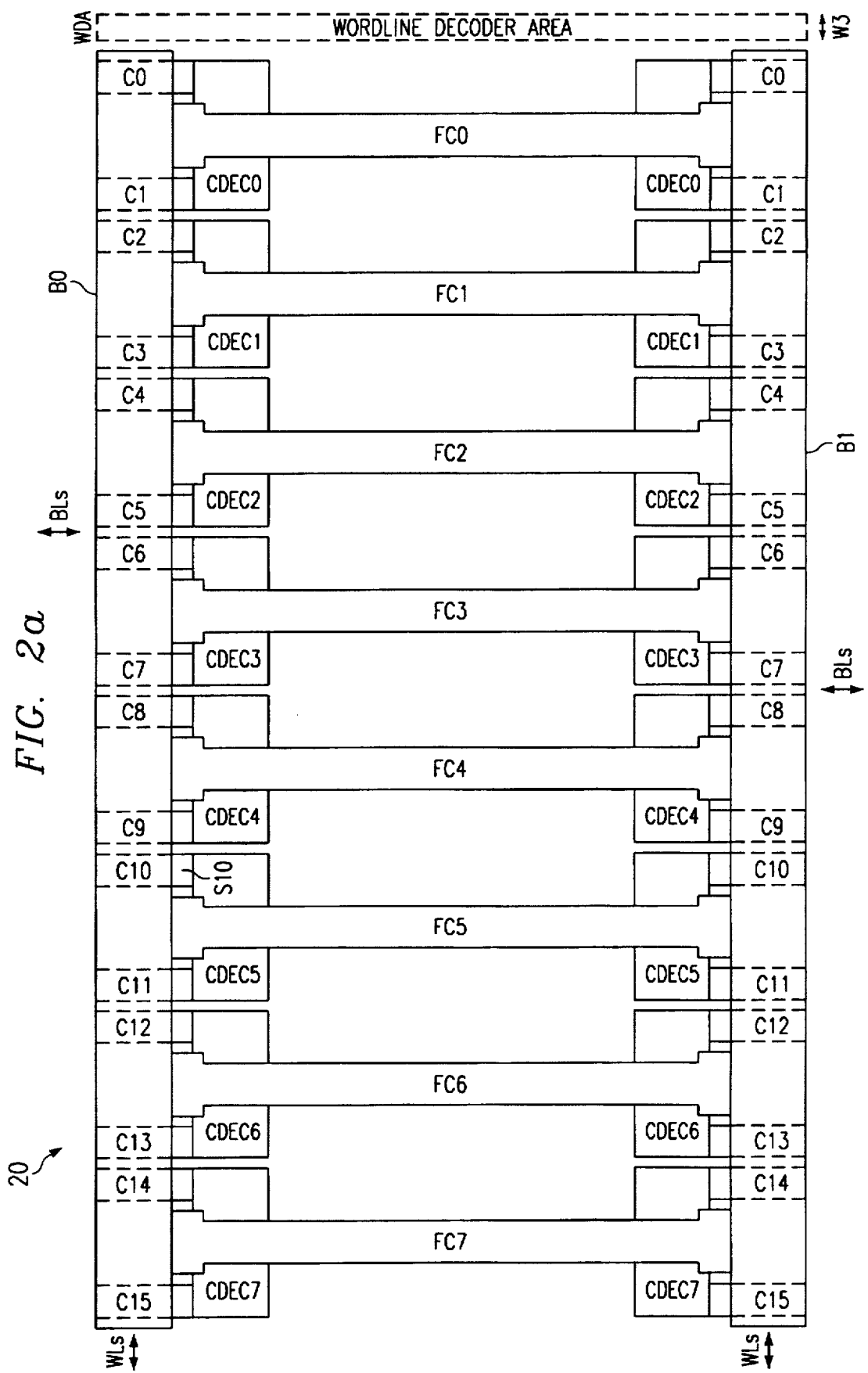
FIG. 2a illustrates a layout diagram of a multiple bank memory configuration in accordance with the present inventive embodiments after the metal 2 layer is formed, and having metal feed conductors formed in the y-dimension in the direct periphery of the configuration.

FIG. 2a illustrates a memory configuration 20 in accordance with the present inventive embodiments and, more particularly, illustrates that configuration during an intermediate step of its construction in an integrated circuit. Note that the integrated circuit which includes memory configuration 20 may of various different types, including but not limited to a stand alone memory integrated circuit, an application specific integrated circuit, a digital signal processor, or a microprocessor. Moreover, the integrated circuit may be constructed using semiconductor fabrication principles ascertainable to one skilled in the art, with a key aspect of the present inventive embodiments being the particular layout as appreciated from the following discussion.

Looking to FIG. 2a, at the point in the manufacture of memory configuration 20 as shown it includes multiple memory banks in the same manner as the prior art, and thus these are shown in the same manner that FIG. 1 illustrates bank B0 and bank B1. Moreover, each of banks B0 and B1 is constructed as described earlier to include a number of wordlines and a number of bitlines which intersect at respective storage cells, and the number of wordlines and bitlines in banks B0 and B1 may vary based on a particular implementation. For comparison to FIG. 1 and further for sake of simplifying the present illustration and discussion, in FIG. 2a a total of sixteen y-select conductors are shown in each bank and in phantom since they are actually formed during a later process discussed below. Additionally, the wordlines are not shown but are understood to be disposed in the horizontal or x-dimension in banks B0 and B1, and the bitlines are not shown but are understood to be in the vertical or y-dimension in banks B0 and B1. Additionally, once more between bank B0 and bank B1 is the direct periphery, which for each bank includes column decode circuits CDEC0 through CDEC7 connected to paired y-select conductors for accomplishing data communication with respect to the bitlines connected to the sense amplifiers to the periphery of the device.

At this point in the discussion of FIG. 2a, note that components as existing in the prior art have been discussed; however, note now the additional elements which distinguish from the prior art and which, as appreciated from other Figures to be discussed, provide improvements to the drawbacks introduced above. Looking to a first distinguishing attribute of memory configuration 20, note that it further includes a plurality of feed conductors labeled FC0 through FC7. Each of feed conductors FC0 through FC7 is preferably a metal conductor formed along the same dimension as the memory bank y-select conductors (i.e., the y-dimension) and, for reasons more clear in later Figures, is formed in an alignment which, if extended, passes between the y-select conductors running over the banks. For example, feed conductor FC0 extends in the y-dimension, and is formed in an alignment which, if extended, passes between the metal 3 y-select conductors C0 and C1 of banks B0 and B1. The dimensions of feed conductors FC0 through FC7 are all the same, with a width of which may be adjusted to maintain the alignment as described above. The length of the feed conductor is dictated by the distance between each of the memory banks or the height of the column decoders and associated power and signal lines. Moreover, each feed conductor has a large contact area at each of its ends for reasons more evident below. Note further in the preferred embodiment that the feed conductors are preferably formed at a metal layer which is formed later in the integrated circuit manufacturing process than the memory banks and the most of the column decoder circuits. Thus, the perspective of FIG. 2a is intended to illustrate that the feed conductors may overlie the circuitry which forms the column decoder circuits. In the illustrated embodiment, the feed conductors are formed in the so-called "metal 2" layer.

Concluding the illustration of FIG. 2a, note that memory configuration 20 also includes a wordline decoder area WDA which, like that of the prior art, represents the area of the integrated circuit that includes the necessary circuitry for receiving the address signal and decoding it to a level sufficient to choose one or several of the wordlines from either bank B0 or bank B1 in response to that address signal. In FIG. 2a, once again the WDA is shown in phantom and spans the y-dimension of both banks B0 and B1. This span is the same length as in FIG. 1 and, thus, once again is illustrated as L in FIG. 2a. However, for reasons more clear below, note that the y-dimension span (or width) of wordline decoder area WDA in FIG. 2b is shown as W3, and it is later shown that W3 is smaller than W1+W2 of FIG. 1.

Figure 2B:
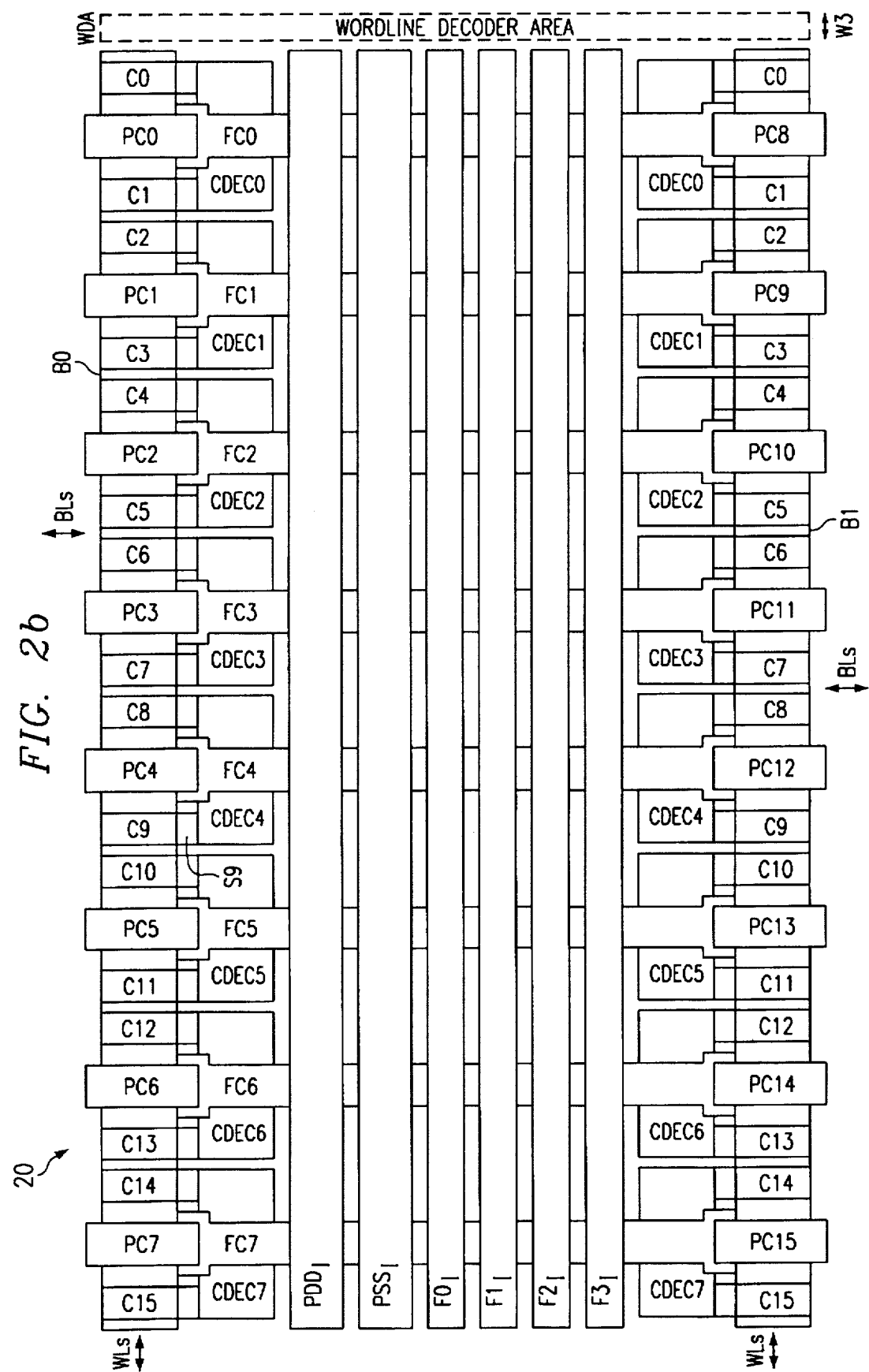

FIG. 2b illustrates memory configuration 20 of FIG. 2a after an additional metalization layer has been formed, and it should be understood that any appropriate intermediate layer(s) is also formed by this point. In the preferred embodiment, therefore, FIG. 2b illustrates memory configuration 20 after the metal 3 layer is created. In this regard, note that the metal 3 layer includes conductors formed in both the x- and y-dimensions. For purposes of simplifying the presentation, each of these groups is discussed separately below.

Directing the discussion now to the metal 3 conductors formed in the x-dimension of FIG. 2b, these conductors are again formed in the direct periphery and are in some manners analogous to the conductors shown in FIG. 1 in the direct periphery of memory configuration 10. Specifically, recall in FIG. 1 there are power conductors PDD and PSS, as well as factor conductors F0 through F2. Similarly, in FIG. 2b, memory configuration 20 includes power conductors $PDD_I$ and $PSS_I$, as well as factor conductors $F0_I$ through $F3_I$. Note that an "I" is added as a subscript to each of these inventive conductors to distinguish each from the conductor of like functionality of FIG. 1. Looking first to the likeness of these conductors, once again they perform the same function as the similarly named conductors of above. Thus, power conductors $PDD_f$ and $PSS_f$ are provided to conduct signals $V_{DD}$ and $V_{SS}$, respectively, to the column decoder circuits in the direct periphery, and factor conductors $F0_f$ through $F3_f$ carry signals to the column decoder circuits as part of the column address decoding functionality. Looking now to a key distinction of the power and factor conductors of FIG. 2b in contrast to FIG. 1, note that the inventive conductors in FIG. 2a only extend in the x-dimension, and they do not extend into the wordline decoder area WDA (in either the x- or y-dimension).

Directing the discussion now to the metal 3 conductors formed in the y-dimension of FIG. 2b (and hence now shown using full lines rather than phantom), these conductors include the sets of y-select conductors C0 through C15 corresponding to each of banks B0 and B1 in the same manner as the prior art, but further include a plurality of programmable conductors PC0 through PC15. The y-select conductors are formed and function in the same manner as in the prior art, that is, to enable a transistor which thus connects a bitline associated to a sense amplifier and to a data line from the periphery circuits to selectively transmit data to and from memory banks B0 and B1. With respect to the programmable conductors, the term "programmable" is used because, as demonstrated later, the functionality of each of these conductors may vary based on the choice of connecting the conductor to a different one of various other conductors and, thus, at the contact level there is the programmability or ability to choose the contact and hence function of the conductor. This aspect is better understood later in connection with FIGS. 2c and 2d. Looking first to the structure of programmable conductors PC0 through PC15, note that each is co-linear with one of the feed conductors formed in the direct periphery. Like the feed conductors, therefore, the programmable conductors extend parallel to the y-select conductors, and are further aligned between the y-select conductors. For example, with respect to bank B0, programmable conductor PC0 is parallel to y-select conductors C0 and C1 as well as between the conductors, and PC0 is also co-linear with feed conductor FC0. Moreover, in the preferred embodiment the programmable conductors are preferably the same width as the feed conductors. The length of the programmable conductors may be varied for reasons appreciated later.

Figure 2C:
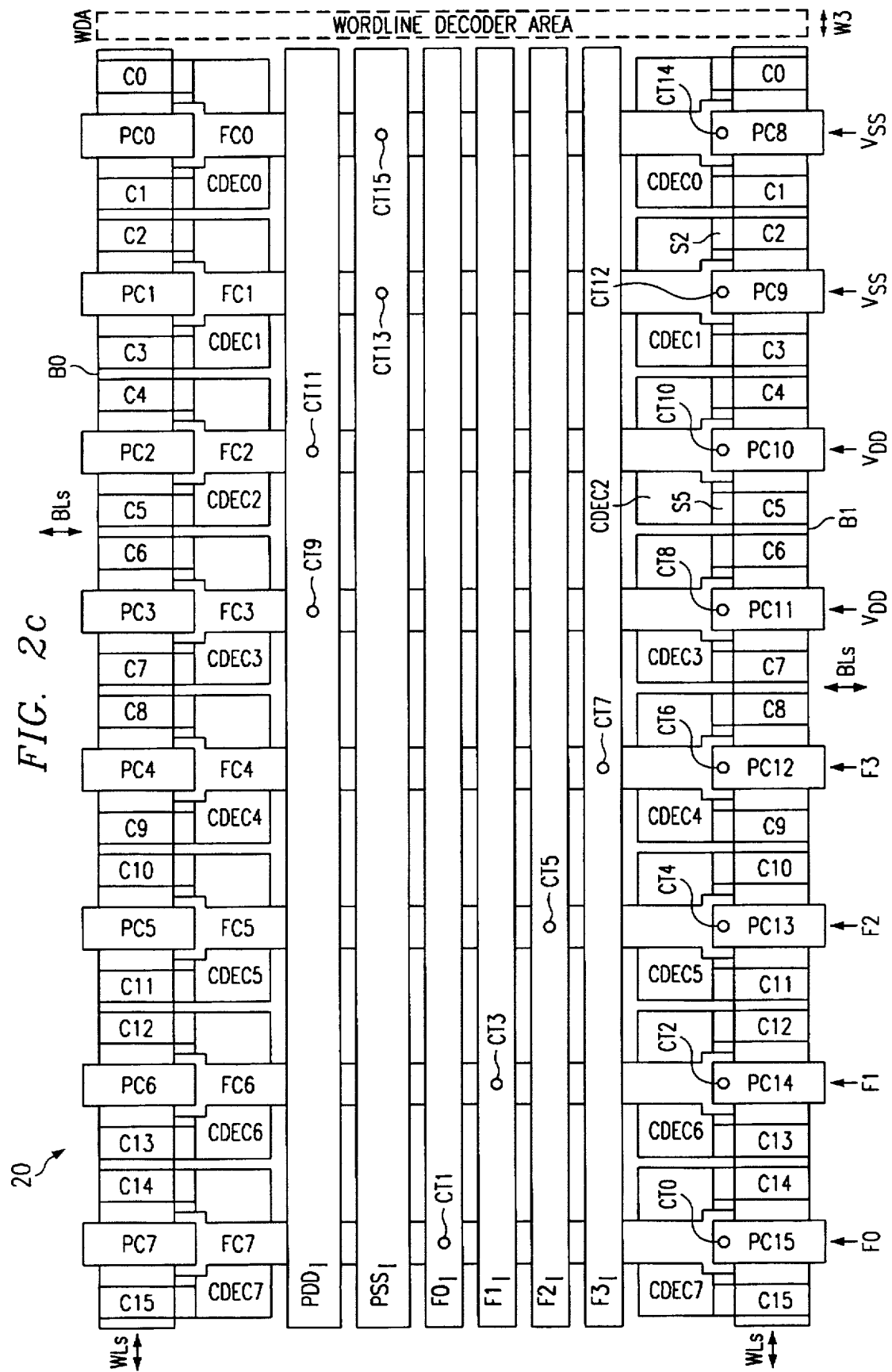
FIG. 2c illustrates the layout diagram of FIG. 2b but includes an example of how contacts formed during the metal 3 layer may program the programmable conductors in a first fashion.

FIG. 2c illustrates memory configuration 20 of FIG. 2b again after the metal 3 layer is formed, but further demonstrates the programmability aspect of conductors PC0 through PC15 by way of various contacts as discussed below. Turning first to the contacts in general as well as their formation, FIG. 2c indicates these contacts as CT0 through CT15. In the preferred embodiment, each contact CT0 through CT15 provides an electrical path between a metal 3 and a metal 2 conductor. For example, contact CT0 connects metal 3 programmable conductor PC15 to metal 2 feed conductor FC7. Also in the preferred embodiment, each contact CT0 through CT15 is formed by creating a via through an insulating layer (not shown) which overlies the metal 2 layer in the area where the contact is to be formed. Thus, when the metal 3 layer is formed, the via fills with metal thereby providing the contacts as shown. In this regard, note also in actuality that contacts CT0 through CT15 would not be visible from the perspective of FIG. 2c, but they are nevertheless shown in FIG. 2c so that the reader may appreciate the location of each contact as well as the two conductors between which each contact provides a conductive path.

Figure 2D:
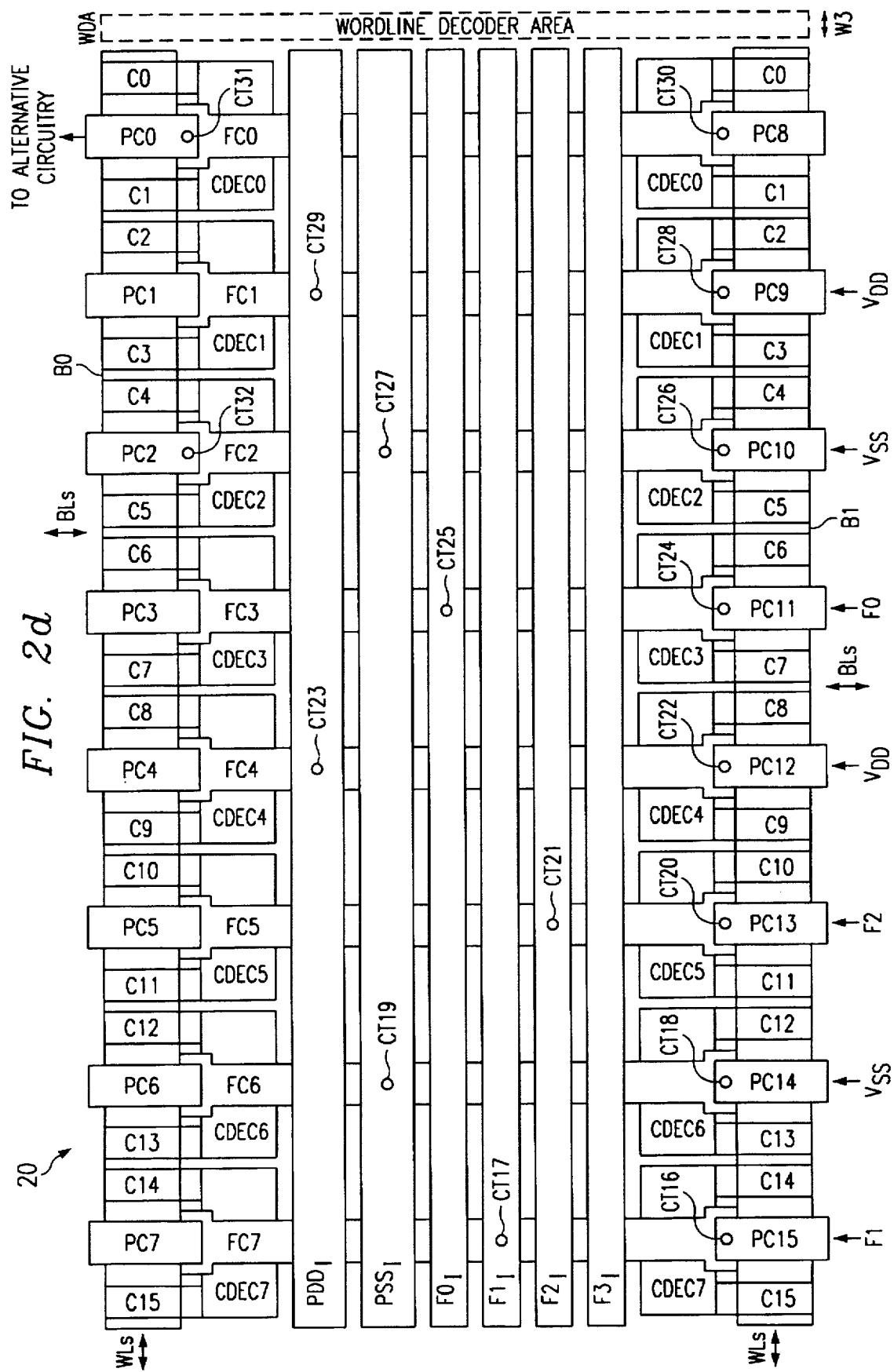
FIG. 2d illustrates the layout diagram of FIG. 2b but includes an example of how contacts formed during the metal 3 layer may program the programmable conductors in a second fashion.

Having introduced contacts CT0 through CT15 in general, note now how the location of each such contact determines the functionality of each of programmable conductors PC0 through PC15. For example, looking to the far left of FIG. 2c, note that contacts CT0 and CT1 are formed to allow programmable conductor PC15 to be used to provide the F0 column decode signal to factor conductor $F0_f$. In other words, note now the operation of the conductive path provided by contacts CT0 and CT1. Contact CT0 connects programmable conductor PC15 to feed conductor FC7, and contact CT1 connects feed conductor FC7 to factor conductor $F0_f$. Thus, to accomplish its functionality, factor conductor $F0_f$ does not require a second portion extending in the y-dimension in area WDA as did the prior art factor conductor of FIG. 1; instead the appropriate factor signal may be applied to programmable conductor PC15 and thereby communicated to factor conductor $F0_f$. Given this example, one skilled in the art should appreciate the remaining examples of factor connections accomplished by way of contacts between metal 2 and metal 3 in FIG. 2c. As another example, therefore, reference is made to programmable conductor PC14 (i.e., second from the left on FIG. 2c). Here, contact CT2 connects programmable conductor PC14 to feed conductor FC6, and contact CT3 connects feed conductor FC6 to factor conductor $F1_f$. Thus, by applying the F1 column decode signal to programmable conductor PC14, it is further provided to factor conductor $F1_f$. Lastly, therefore, one skilled in the art will appreciate the comparable connection of programmable conductor PC13 to factor conductor $F2_f$ using contacts CT4 and CT5, and programmable conductor PC12 to factor conductor $F3_f$ using contacts CT6 and CT7. Having shown the effect of connections between programmable conductor and factor conductor, note now that any other alternative programmable conductor could have been selected to connect to a corresponding factor conductor. For example, looking briefly to FIG. 2d, note that it again illustrates memory configuration 20 of FIG. 2b after the metal 3 layer and its contacts to metal 2 are formed, but here depicts an alternative contact pattern. In FIG. 2d, note that programmable conductor PC15 is connected to factor conductor $F1_f$ (through contacts CT16 and CT17) rather than to factor conductor $F0_f$. Other examples of different connections are likewise illustrated in FIG. 2d. In any event, from FIGS. 2b through 2d one skilled in the art will appreciate that the choice of which programmable conductor corresponds to which factor conductor is completely at the discretion of the designer at the time of determining the contacts for the metal 3 to metal 2 layer; in other words, it is in this context that programmable conductors PC0 through PC15 are indeed programmable in the sense that the functionality (i.e., the signal provided) by each such conductor may be chosen at this contact level. This same concept is further true with respect to power as well as potentially other connections to the programmable conductors, as further detailed below.

Continuing with FIG. 2c, reference is now made to the use of various programmable conductors for purposes of connecting to power conductors $PDD_f$ and $PSS_f$. Particularly, as illustrated, note that electrical contacts are used to connect programmable conductors PC10 and PC11 to power conductor $PDD_f$, and programmable conductors PC8 and PC9 to power conductor $PSS_f$. Again, the contacts which provide these connections are preferably formed in the manner described above. For example, to connect programmable conductor PC11 to power conductor $PDD_f$, contacts CT8 and CT9 are created by forming vias in the appropriate locations in the insulating layer above feed conductor FC3, and these vias are then filled during the metalization of the metal 3 layer which also forms programmable conductor PC11. Thus, one skilled in the art will further appreciate how the remaining programmable conductors are likewise connected, through corresponding metal contacts, to either power conductor $PDD_f$ or power conductor $PSS_f$. Indeed, note further in the preferred embodiment that any of the programmable conductors which are not used to connect to a feed conductor (or for other purposes described below) are instead connected to one of the two power conductors. This approach is preferred to ensure minimum resistance of the power connection between the power conductors over the direct periphery area and the source of the power lines in the periphery. For this reason, FIG. 2c illustrates each of programmable conductors PC8 through PC11 (i.e., those programmable conductors which are not connected to a factor conductor) connected to one of the two power conductors.

Having presented the layout and functionality of the various conductors of FIG. 2c, note now a key benefit as compared to the prior art approach shown in FIG. 1. Specifically, recall that the area of wordline decoder area WDA in memory configuration 10 in part is determined by the portion W1*L which arises from the extensions of the factor and power conductors into that area, in the x-dimension. However, note now that programmable conductors of FIGS. 2a and 2b provide a like functionality, while not extending into wordline decoder area WDA of those Figures. In other words, W1 is effectively removed from the area requirements of memory configuration 20. Consequently, the overall size of the integrated circuit forming memory configuration 20 may be smaller, thereby providing a more efficient and improved device.

Looking again to the alternative contact pattern shown in FIG. 2d, some additional observations are stated now arising from the flexibility of memory configuration 20. First, as introduced earlier, the alternatives of FIG. 2d demonstrate that different programmable conductors may be connected to different ones of the factor and power conductors, with the choice made at the contact level. Second, note now the additional benefit of having programmable conductor overlie both of memory banks B0 and B1. Particularly, at the far right of FIG. 2d note that programmable conductor PC8 is not connected to any of the factor or power conductors. Instead, however, a contact CT30 connects programmable conductor PC8 to feed conductor FC0, and a contact CT31 connects feed conductor FC0 to programmable conductor PC0. Because programmable conductor PC0 overlies bank B0, then any alternative circuitry beyond bank B0 may connect to programmable conductor PC0 and thus connect to this electrical path. In other words, by forming programmable conductors in a symmetrical manner over each of the memory banks, there is the additional possibility of using contacts to carry signals over each of the memory banks in this fashion. As yet an additional aspect in this regard, note that a signal may connect to one of the power or factor conductors, and further to alternative circuitry. This possibility is shown by way of example in connection with programmable conductor PC10. Specifically, programmable conductor PC10 is connected by way of contacts CT26 and CT27 to power conductor $PSS_f$. However, note further that contact CT32 further provides an electrical path from programmable conductor PC10 to programmable conductor PC2. Thus, alternative circuitry having access to programmable conductor PC2 may also tap in to the power signal (i.e., $V_{SS}$) available on programmable conductor PC10.

From the above, it may be appreciated that the above embodiments provide an improved memory configuration over the prior art. Additionally, while the present embodiments have been described in detail, various substitutions, modifications or alterations could be made to the descriptions set forth above without departing from the inventive scope. Some of these examples are discussed above, while still others will be ascertainable by one skilled in the art. Indeed, as a few examples, note that the length of the programmable conductors may be adjusted based on the circuitry to which the conductors are attached. As another example, while the embodiments of FIGS. 2a through 2c illustrate programmable conductors over both memory banks, in an alternative embodiment those conductors may be formed over only one array, thereby extending into the direct periphery while not permitting the extended connection technique discussed by way of example with respect to programmable conductors PC0 and PC8 of FIG. 2d. As still another alternative, while the programmable conductor are preferably formed in a symmetrical manner to exist between y-select conductors, some of those may be eliminated (i.e. not formed during the metal 3 formation) while leaving enough programmable conductors to permit connection to the direct periphery factor and power conductors. As yet another alternative, while the above approach illustrates the feed conductors formed in metal 2 and the programmable conductors formed in metal 3, different metal layers could be used to form these conductors and indeed the order may be reversed such that the programmable conductors are formed before the feed conductors. As a final example, while the above Figures illustrate only two memory banks, the teachings of this document may apply to other multiple memory bank configurations as well. Thus, these examples as well as the preceding teachings further demonstrate the flexibility and considerations of the inventive scope, as defined by the following claims.

We claim:

1. A memory configuration, comprising:
   a first and second bank array, wherein each of the first and second bank arrays comprises:
   a plurality of wordlines, wherein the plurality of wordlines of the first bank array are generally parallel to the plurality of wordlines of the second bank array; and
   a plurality of bitlines, wherein the plurality of bitlines of the first bank array are generally orthogonal to the plurality of wordlines of the first bank array and wherein the plurality of bitlines of the second bank array are generally orthogonal to the plurality of wordlines of the second bank array;
   a plurality of column decoder circuits;
   a plurality of y-select conductors generally parallel to the plurality of bitlines of the first and second bank arrays, wherein each of the plurality of y-select conductors is operable to be selected by one of the plurality of column decoder circuits in response to a column address;
   a plurality of column factor conductors formed in a direct periphery area existing between the first and second bank arrays, and aligned generally parallel to the plurality of wordlines of the first and second bank arrays;
   a power conductor formed between the first and second bank arrays, and aligned generally parallel to the plurality of wordlines of the first and second bank arrays; and
   a plurality of programmable conductors disposed between and generally parallel to the plurality of y-select conductors and formed such that a first portion of each of the plurality of programmable conductors overlies the first bank array and a second portion of each of the plurality of programmable conductors extends toward the direct periphery area, wherein each of the plurality of programmable conductors may be selected for connecting to a corresponding one of the plurality of column factor conductors or to the power conductor.

2. The memory configuration of claim 1 wherein each of the plurality of programmable conductors is formed of a same width as each other of the plurality of programmable conductors.

3. The memory configuration of claim 1 and further comprising a plurality of electrical paths between at least two of the plurality of programmable conductors and the power conductor.

4. The memory configuration of claim 3 wherein each of the plurality of electrical paths comprises:

a feed conductor formed co-linear with respect to a corresponding one of the at least two of the plurality of programmable conductors;

a first electrical contact formed between the corresponding one of the at least two of the plurality of programmable conductors and the feed conductor; and a second electrical contact formed between the corresponding one of the at least two of the plurality of programmable conductors and the power conductor.

5. The memory configuration of claim 4:

wherein the memory configuration is formed within an integrated circuit comprising a plurality of metal layers overlying a semiconductor substrate;

wherein the feed conductors for each of the plurality of electrical paths are formed in a first metal layer of the plurality of metal layers; and wherein the plurality of programmable conductors are formed in a second metal layer of the plurality of metal layers at a different level than the first metal layer.

6. The memory configuration of claim 5 wherein the second metal layer is farther from the semiconductor substrate than the first metal layer.

7. The memory configuration of claim 1 and further comprising a plurality of electrical paths, wherein each of the electrical paths couples a respective one of the plurality of programmable conductors to a respective one of the plurality of column factor conductors.

8. The memory configuration of claim 7 wherein each of the electrical paths comprises:

a feed conductor formed co-linear with respect to a corresponding one of the plurality of programmable conductors;

a first electrical contact formed between the corresponding one of the plurality of programmable conductors and the feed conductor; and a second electrical contact formed between the corresponding one of the plurality of programmable conductors and the respective one of the plurality of column factor conductors.

9. The memory configuration of claim 8:

wherein the memory configuration is formed within an integrated circuit comprising a plurality of metal layers overlying a semiconductor substrate;

wherein the feed conductors for each of the plurality of electrical paths are formed in a first metal layer of the plurality of metal layers; and wherein the plurality of programmable conductors are formed in a second metal layer of the plurality of metal layers at a different level than the first metal layer.

10. The memory configuration of claim 9 wherein the second metal layer is farther from the semiconductor substrate than the first metal layer.

11. The memory configuration of claim 1:

wherein the power conductor comprises a first power conductor; and further comprising a second power conductor formed between the first and second bank arrays, and aligned generally parallel to the plurality of wordlines of the first and second bank arrays.

12. The memory configuration of claim 11:

wherein the first power conductor is coupled to provide a first voltage potential; and wherein the second power conductor is coupled to provide a second voltage potential lower than the first voltage potential.

13. The memory configuration of claim 12:

wherein for a first set of the plurality of programmable conductors, each of the programmable conductors of the first set is electrically connected to a corresponding one of the plurality of column factor conductors; and wherein for a second set of the plurality of programmable conductors consisting of all programmable conductors not in the first set, each of the programmable conductors of the second set is electrically connected to either the first power conductor or the second power conductor.

14. The memory configuration of claim 1:

wherein the plurality of programmable conductors comprises a first plurality of programmable conductors; and further comprising a second plurality of programmable conductors disposed between and generally parallel to the plurality of y-select conductors of the second bank array and formed such that a first portion of each of the plurality of programmable conductors overlies the second bank array.

15. The memory configuration of claim 14 wherein each of the first and second plurality of programmable conductors is formed of a same width as the other of the first and second plurality of programmable conductors.

16. The memory configuration of claim 14 and further comprising an electrical path coupling one of the first plurality of programmable conductors to one of the second plurality of programmable conductors.

17. The memory configuration of claim 1 wherein the memory configuration is part of a stand alone memory integrated circuit.

18. The memory configuration of claim 1 wherein the memory configuration is part of an application specific integrated circuit.

19. The memory configuration of claim 1 wherein the memory configuration is part of a digital signal processor.

20. The memory configuration of claim 1 wherein the memory configuration is part of a microprocessor.

21. The memory configuration of claim 1:

wherein the plurality of y-select conductors equals an integer N of y-select conductors; and wherein the plurality of programmable conductors equals N/2 programmable conductors.

22. A method of forming a memory configuration in an integrated circuit, comprising the steps of:

forming a first and second bank array, wherein each of the first and second bank arrays comprises:

a plurality of wordlines, wherein the plurality of wordlines of the first bank array are generally parallel to the plurality of wordlines of the second bank array; and a plurality of bitlines, wherein the plurality of bitlines of the first bank array are generally orthogonal to the plurality of wordlines of the first bank array and wherein the plurality of bitlines of the second bank array are generally orthogonal to the plurality of wordlines of the second bank array;

forming a plurality of column decoder circuits;

forming a plurality of y-select conductors generally parallel to the plurality of bitlines of each of the first and second bank arrays, wherein each of the plurality of y-select conductors is operable to be selected by one of the plurality of column decoder circuits in response to a column address;

forming a plurality of column factor conductors formed in a direct periphery area existing between the first and second bank arrays, and aligned generally parallel to the plurality of y-select conductors of the first and second bank arrays;

forming a power conductor formed between the first and second bank arrays, and aligned generally parallel to the plurality of wordlines of the first and second bank arrays;

forming a plurality of programmable conductors disposed between and generally parallel to the plurality of column select conductors and formed such that a first portion of each of the plurality of programmable conductors overlies the first bank array and a second portion of each of the plurality of programmable conductors extends toward the direct periphery area;

forming an electrical path between each of a first set of the plurality of programmable conductors and a corresponding one of the plurality of column factor conductors; and forming an electrical path between each of a second set of the plurality of programmable conductors and the power conductor.

23. The method of claim 22 wherein the step of forming the plurality of programmable conductors comprises forming each of the plurality of programmable conductors of a same width as each other of the plurality of programmable conductors.

24. The method of claim 22 wherein the second set of the plurality of programmable conductors consists of at least two programmable conductors.

25. The method of claim 22:
wherein the integrated circuit comprises a plurality of metal layers overlying a semiconductor substrate;

wherein the feed conductors for each of the plurality of electrical paths are formed in a first metal layer of the plurality of metal layers; and wherein the plurality of programmable conductors are formed in a second metal layer of the plurality of metal layers at a different level than the first metal layer.

26. The method of claim 25 wherein the second metal layer is farther from the semiconductor substrate than the first metal layer.

27. The method of claim 22:
wherein the power conductor comprises a first power conductor; and
further comprising the steps of:
forming a second power conductor formed between the first and second bank arrays, and aligned generally parallel to the plurality of wordlines of the first and second bank arrays; and
forming an electrical path between each of a third set of the plurality of programmable conductors and the second power conductor.

28. The method of claim 22:
wherein the plurality of programmable conductors comprises a first plurality of programmable conductors; and
further comprising the step of forming a second plurality of programmable conductors disposed between and generally parallel to the plurality of column select conductors and formed such that a first portion of each of the plurality of programmable conductors overlies the second bank array.

29. The method of claim 28 wherein the step of forming the second plurality of programmable conductors comprises forming each of the second plurality of programmable conductors of a same width as each other of the second plurality of programmable conductors.

30. The method of claim 28 and further comprising the step of forming an electrical path coupling one of the first plurality of programmable conductors to one of the second plurality of programmable conductors.

31. The method of claim 22 wherein the memory configuration is part of a stand alone memory integrated circuit.

32. The method of claim 22 wherein the memory configuration is part of an application specific integrated circuit.

33. The method of claim 22 wherein the memory configuration is part of a digital signal processor.

34. The method of claim 22 wherein the memory configuration is part of a microprocessor.

35. The method of claim 22:
wherein the plurality of select conductors equals an integer N of y-select conductors; and
wherein the plurality of programmable conductors equals N/2 programmable conductors.

* * * * *

UNITED STATES PATENT AND TRADEMARK OFFICE
CERTIFICATE OF CORRECTION

PATENT NO. : 5,896,310
DATED : 04/20/99
INVENTOR(S) : J. Patrick Kawamura, Harvey A. Vargas It is certified that error appears in the above-identified patent and that said Letters Patent is hereby corrected as shown below:

On the title page: Item [75]

"Inventors"

J. Patrick Kawamura, Harvey A. Vargas --

Signed and Sealed this

Twentieth Day of June, 2000

Attest:

Q. TODD DICKINSON

*Attesting Officer*  *Director of Patents and Trademarks*